United States Patent
Zhang et al.

(10) Patent No.: US 6,524,932 B1
(45) Date of Patent: Feb. 25, 2003

(54) METHOD OF FABRICATING GROUP-III NITRIDE-BASED SEMICONDUCTOR DEVICE

(75) Inventors: Xiong Zhang, Singapore (SG); Soo Jin Chua, Singapore (SG)

(73) Assignee: National University of Singapore, Singapore (SG)

(*) Notice: Subject to any disclaimer, the term of this patent is extended or adjusted under 35 U.S.C. 154(b) by 0 days.

(21) Appl. No.: 09/787,114

(22) PCT Filed: Sep. 3, 1999

(86) PCT No.: PCT/SG99/00091
§ 371 (c)(1),
(2), (4) Date: Jun. 18, 2001

(87) PCT Pub. No.: WO00/16378
PCT Pub. Date: Mar. 23, 2000

(30) Foreign Application Priority Data

Sep. 15, 1998 (SG) .............................. 9803670

(51) Int. Cl.$^7$ .............................................. H01L 21/30
(52) U.S. Cl. .................... 438/459; 257/103; 257/76; 257/200
(58) Field of Search .................... 257/103, 76, 200; 438/459

(56) References Cited

U.S. PATENT DOCUMENTS

| | | | |
|---|---|---|---|
| 5,130,269 A | | 7/1992 | Kitahara et al. |
| 5,213,991 A | * | 5/1993 | Inokawa et al. |
| 5,239,188 A | | 8/1993 | Takeuchi et al. |
| 5,290,393 A | | 3/1994 | Nakamura |
| 5,389,571 A | | 2/1995 | Takeuchi et al. |
| 5,834,331 A | | 11/1998 | Razeghi |
| 5,838,029 A | | 11/1998 | Shakuda |
| 6,191,007 B1 | * | 2/2001 | Matsui et al. ............... 438/459 |

FOREIGN PATENT DOCUMENTS

| | | |
|---|---|---|
| EP | A340113 | 11/1989 |
| EP | A1764989 | 3/1997 |
| JP | A7235692 | 9/1995 |
| JP | A8064913 | 3/1996 |
| JP | A9018092 | 1/1997 |
| JP | A9249499 | 9/1997 |
| WO | WO99/59195 | 11/1999 |

OTHER PUBLICATIONS

Steckl et al., Appl. Phys. Lett., vol. 69, No. 15, pp. 2264–2266 (1996).
Wang et al., Appl. Phys. Lett. vol. 72, No. 1, pp. 109–111 (1998).
Guha et al., Appl. Phys. Lett., vol. 72, No. 4, pp. 415–417 (1998).
Osinsky et al., Appl. Phys. Lett., vol. 72, No. 5, pp. 551–553 (1998).
Yang et al., Appl. Phys. Lett., vol. 69, No. 23, pp. 3566–3568 (1996).
Kobayashi et al., Appl. Phys. Lett., vol. 71, No. 24, pp. 3569–3571 (1997).

* cited by examiner

Primary Examiner—Long Pham
Assistant Examiner—Khiem Nguyen
(74) Attorney, Agent, or Firm—Birch, Stewart, Kolasch & Birch, LLP

(57) ABSTRACT

Disclosed are a group-III nitride-based semiconductor device that is grown over the surface of a composite intermediate layers consisting of a thin amorphous silicon film or any stress-relief film or a combination of them and at least one multi-layered buffer on silicon substrate, and a method of fabricating the same device. The intermediate layers that suppress the occurrence of crystal defects and propagation of misfit dislocations induced by the lattice mismatch between the epitaxial layer and substrate, ca n be grown on a part or the entirety of the surface of a silicon (001) or (111) substrate which can be single crystal or coated with a thin amorphous silicon film. Then at least one layer or multiple layers of high quality group-III nitride-based semiconductors are grown over the composite intermediate layers.

9 Claims, 6 Drawing Sheets

| Ni/Au CONTACT |
|---|
| p-GaN LAYER 0.5~1 µm |
| p-Al$_x$Ga$_{1-x}$N (x = 0.1) LAYER 100 nm |
| In$_y$Ga$_{1-y}$N (0<y≤0.5) QUANTUM WELL |
| n-Al$_x$Ga$_{1-x}$N (x = 0.1) LAYER 100 nm |
| n-GaN LAYER 0.5~2 µm |
| SIX-PERIOD GaN/Al$_x$Ga$_{1-x}$N (x = 0.2) MULTI-LAYERED BUFFER |
| AMORPHOUS SILICON FILM (<500 nm) |
| n-SILICON-(001) SUBSTRATE COATED WITH 150 nm-THICK AMORPHOUS SILICON FILM |
| Ti/Au CONTACT |

FIG. 6

METHOD OF FABRICATING GROUP-III NITRIDE-BASED SEMICONDUCTOR DEVICE

This application is the national phase under 35 U.S.C. §371 of PCT International Application No. PCT/SG99/00091 which has an International filing date of Sep. 3, 1999, which designated the United States of America.

BACKGROUND OF THE INVENTION

1. Field of the Invention

The present invention relates to a method for fabricating group-III nitride-based compound semiconductor devices grown on a substrate consisting of, for example, silicon and, more particularly, to a method for growing epitaxial layers of group-III nitride-based compound semiconductors by means of metalorganic chemical vapor deposition (to be referred to as MOCVD hereinafter).

2. Description of the Related Art

To realize high-efficiency, high-brightness blue and ultraviolet light-emitting diodes and lasers, group-III nitride and related compound semiconductors have been researched and developed in recent years. As a method for growing group-III nitride and related compound semiconductors, MOCVD is currently widely used.

In a typical MOCVD process, group-III nitride is grown hetero-epitaxially on a sapphire substrate which is most frequently used at present. However, since sapphire is an insulating material and extremely rigid, it is not easy to fabricate a group-III nitride-based semiconductor device on a sapphire substrate. Silicon is one of the proposed substrate materials to overcome this shortcoming because of its high quality, large size, low cost, and the potential application to integrated opto-electronic devices. However, due to the large differences in lattice constant and thermal expansion coefficient between the group-III nitride and silicon, it is really difficult to grow high quality epitaxial layer of group-III nitride-based compound semiconductor on a silicon substrate. In order to solve this problem, many attempts have been made to grow group-III nitrides on silicon substrates in the past decade using various kinds of materials as the intermediate layer between group-III nitride and silicon substrate. These include AlN (U.S. Pat. Nos. 5,239,188 and 5,389,571, and Appl. Phys. Lett. Vol. 72, 1998, pp. 415–417, and 551–553), carbonized silicon (Appl. Phys. Lett. Vol. 69, 1996, pp. 2264–2266), nitridized GaAs (Appl. Phys. Lett. Vol. 69, 1996, pp. 3566–3568), oxidized AlAs (Appl. Phys. Lett. Vol. 71, 1997, pp. 3569–3571), and $\gamma$-$Al_2O_3$ (Appl. Phys. Lett. Vol. 72, 1998, pp. 109–111). In particular, by using AlN as the intermediate layer and the molecular beam epitaxy technology, ultraviolet and violet light-emitting diodes of group-III nitride grown on silicon substrate have been demonstrated recently (Appl. Phys. Lett. Vol. 72, 1999, pp. 415–417). However, the turn-on voltages as well as the brightness of these diodes do not approach the performance levels of corresponding devices grown on sapphire substrates by MOCVD. Therefore, the crystal growth method needs to be further improved in order to enhance the crystallinity of the group-III nitride-based compound semiconductors and to fabricate good quality opto-electronic devices.

SUMMARY OF THE INVENTION

The present invention has been made in consideration of the above situation and as one of its objectives, provides for a group-III nitride-based compound semiconductor-based device which emits and detects light with a wavelength covering from green to ultraviolet ranges, and is formed on a silicon substrate, having the above mentioned advantages, e.g. high crystal quality, large wafer size, low cost, well-established processing technology, and potential application to integrating optical devices with electronic devices on the same silicon chip.

It is another objective of the present invention to provide a crystal growth method for a group-III nitride-based compound semiconductor on a silicon substrate, yielding high quality p- or n-type conductor layers with excellent characteristics so as to allow formation of an excellent p-n junction for fabrication of a group-III nitride-based light-emitting device, laser diode, photodetector, field effect transistor, and other opto-electronic devices.

According to the present invention, there is provided a crystal growth method for group-III nitride and related compound semiconductors on silicon substrates, comprising of the following steps:

Thermal treating a silicon (001) or (111) substrate which is a single crystal or coated with a thin amorphous silicon film or any stress-relief film or a combination of them in a MOCVD reactor chamber under hydrogen ambient at a high temperature (preferably over 900° C.) for at least 5 minutes;

MOCVD-growing an ultra-thin (preferably less than 500 nm) amorphous silicon film on a part of or the entire surface of the above mentioned silicon (001) or (111) substrate at a lower temperature (preferably between 400–710° C.) using hydrogen-diluted silane as precursor;

MOCVD-growing at least one periodic or non-periodic multi-layered buffer on the top of the formed ultra-thin amorphous silicon film at a low temperature (preferably between 400–750° C.). Within the multi-layered buffer, the layers alternate between two types of compound semiconductors different from each other in lattice constant, energy band gap, layer thickness, and composition;

MOCVD-growing a single layer or multiple layers of group-III nitride-based compound semiconductors over the composite intermediate layers consisting of an ultra-thin amorphous silicon film or any stress-relief film or a combination of them and a multi-layered buffer at a higher temperature (preferably in the range of 750–900° C.); and MOCVD-growing at least one layer or multiple layers of group-III nitride-based compound semiconductors on the top of all of the intermediate layers to form an opto-electronic or electronic device at a high temperature (preferably higher than 900° C.).

According to the present invention, the group-III nitride-based compound semiconductor layers can be doped n- or p-type as it is MOCVD-grown over the obtained composite intermediate layers on a silicon substrate with excellent characteristics so as to form an excellent p-n junction for fabricating group-III nitride-based opto-electronic devices.

Additional objectives and advantages of the invention will be set forth in the description which follows, and in part will be obvious from the description, or may be learned by practice of the invention. The objectives and advantages of the invention may be realized and obtained by means of the techniques and combinations thereof particularly pointed out in the appended claims.

BRIEF DESCRIPTION OF THE DRAWINGS

The accompanying drawings, which are incorporated and constitute a part of the specification, illustrate presently preferred embodiments of the invention, and together with the general description given above and the detailed description of the preferred embodiments given below, serve to explain the principles of the invention.

This peak corresponds to the (0002) diffraction from the wurtzite GaN film and is much more intense than that from the silicon substrate, indicating once again that the crystal quality of GIN-based semiconductor grown on a silicon substrate can be significantly improved by using the composite intermediate layers.

FIG. 6 is a schematic sectional view showing a GaN-based light-emitting diode grown over composite intermediate layers consisting of art ultra-thin (less than 500 nm) amorphous silicon film and a six period $GaN/Al_xGa_{1-x}N$ (x=0.1) multi-layered buffer on a n-type silicon (001) substrate which is coated with a 150 nm-thick amorphous silicon film according to Example 2 of the present invention.

DETAILED DESCRIPTION OF THE PREFERRED EMBODIMENT

According to a preferred embodiment of the present invention, a method for growing the group-III nitride-based compound semiconductors on silicon substrates will now be described. It is to be noted that the embodiment only illustrates the invention and the invention is not limited thereto.

Figure 2:
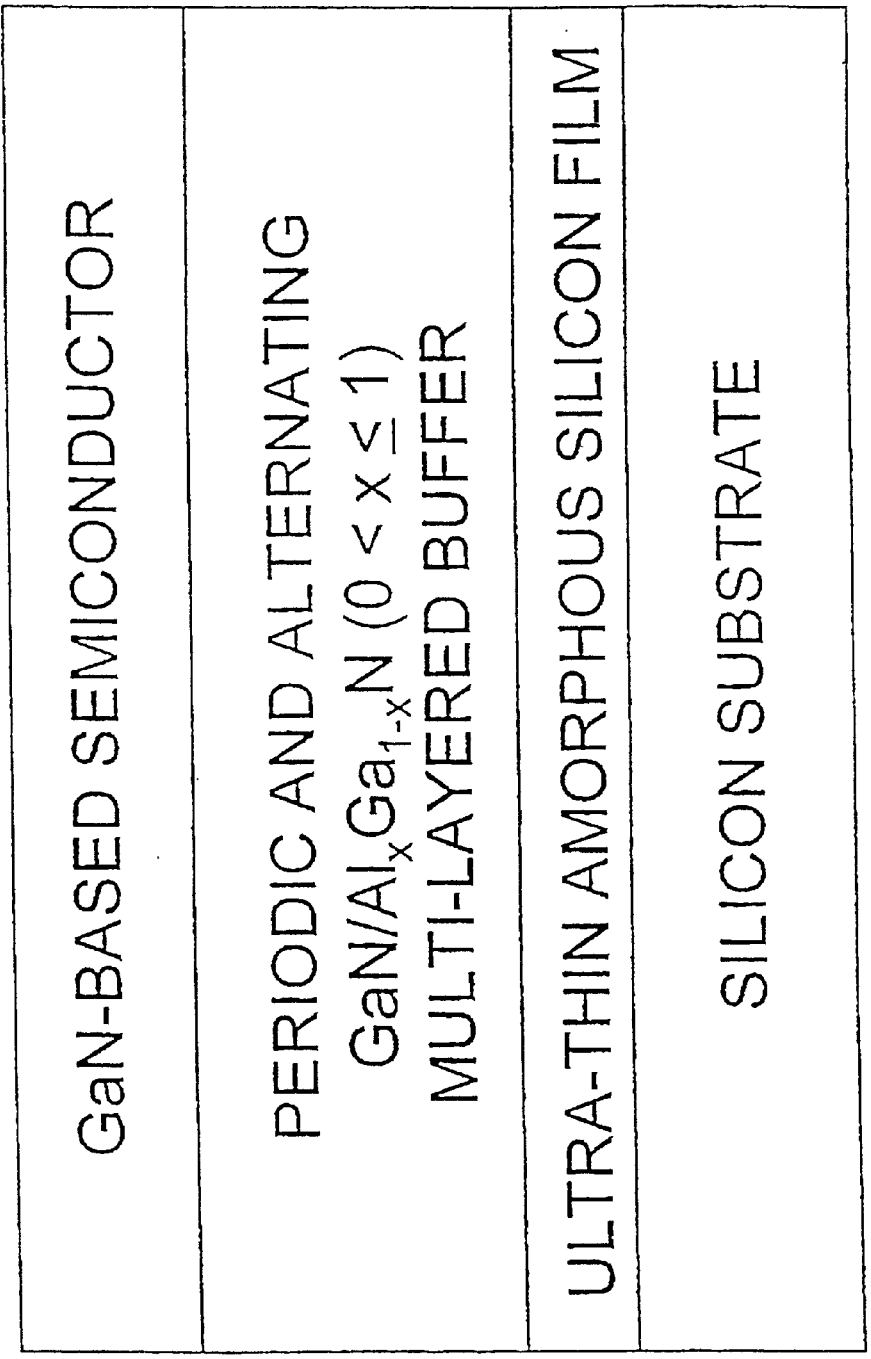
FIG. 2 is a schematic sectional view showing a GaN-based semiconductor grown over composite intermediate layers consisting of an ultra-thin amorphous silicon film or any stress-relief film or a combination of them and a periodic and alternating $GaN/Al_xGa_{1-x}N$ (0<x<1) multi-layered buffer on a silicon substrate according to the preferred embodiment of the present invention.

As shown in FIG. 2, after standard chemical cleaning process, a silicon (001) or (111) substrate which can be a single crystal or coated on the surface with a thin amorphous silicon film or any stress-relief film or a combination of them is thermal-treated in a MOCVD reactor chamber under hydrogen ambient at a high temperature (preferably over 900° C.) for at least 5 minutes in order to produce a clean, oxide-free surface.

The temperature is then reduced to a low temperature (preferably between 400–750° C.), and an ultra-thin preferably less than 500 nm) amorphous silicon film is deposited on a part of or the entirety of the surface of the above mentioned silicon (001) or (111) substrate using hydrogen-diluted silane as precursor in order to form a "soft" buffer on the silicon substrate.

Subsequently, by means of our newly-developed growth technique (Singapore Patent Application No. 9801054-9, "Crystal growth method for group-III nitride and related compound semiconductors"), a periodic or non-periodic multi-layered buffer in which the layers alternate between two types of group-III nitride-based compound semiconductors A and B different from each other in lattice constant, energy band gap, layer thickness, and solid composition, is grown on the top of the above-mentioned ultra-thin amorphous silicon film by atmospheric-pressure or low-pressure (60–100 Torr) MOCVD at a low temperature preferably between 400–750° C.). Since the growth temperature for this multi-layered buffer is much lower than the temperature at which a E-nitride single crystal can be formed, the buffer layer is of an amorphous or polycrystalline state.

The growth temperature is then raised to a mediate temperature (preferably in the range of 750–900° C.), a single layer or multiple layers of group-III nitride-based compound semiconductors is/are grown by MOCVD over the composite intermediate layers to form a secondary multi-layered buffer and further accommodate the stress induced by the lattice mismatch between III-nitrides and a silicon substrate.

Finally the growth temperature is raised to a high temperature (preferably higher than 900° C.), then at least one layer or multiple layers of group-III nitride-based compound semiconductors are grown over the surface of the composite intermediate layers consisting of the pre-grown ultra-thin amorphous silicon film or any stress-relief film or a combination of them and the multi-layered buffers. According to the present invention, it is clear that the group-III nitride-based compound semiconductor layers can be doped n- or p-type as it is MOCVD-grown over the composite intermediate layers on a silicon substrate so as to form a p-n junction for fabricating group-III nitride-based opto-electronic devices.

Figure 1:
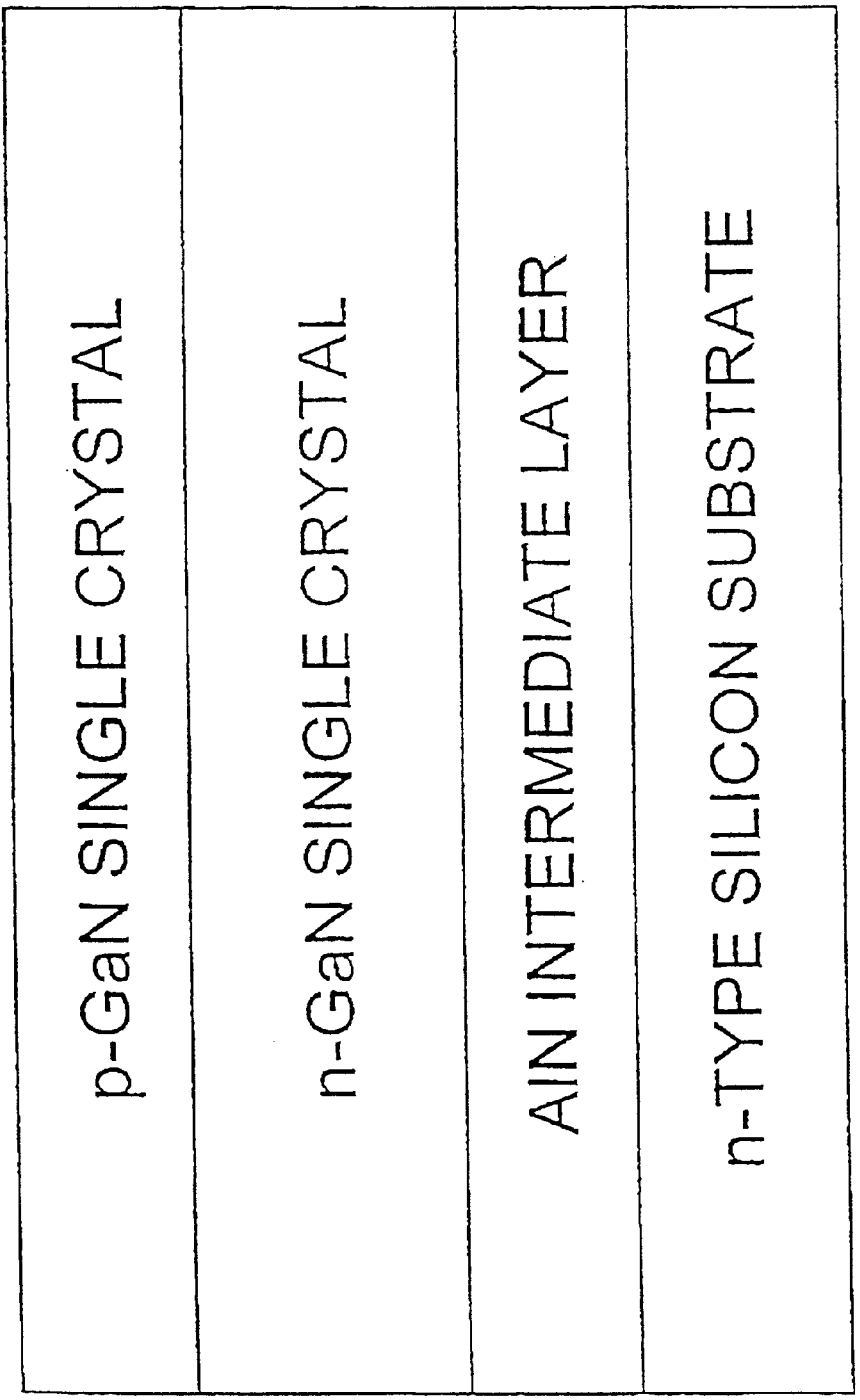
FIG. 1 is a schematic sectional view showing p-GaN and n-GaN crystals grown over a conventional AlN intermediate layer on a silicon substrate.

It is known that as the temperature is raised from a low temperature (say 500° C.) to a high temperature (say 1,000° C.), both the ultra-thin amorphous silicon film and the amorphous or polycrystalline multi-layered buffer will partially change to single or poly-crystalline state due to the recrystallizing effect, which serve as seed crystals for the subsequent growth of the nitride-based compound semiconductor films. Compared with the conventional AlN single buffer shown in FIG. 1, the composite intermediate layers of the present invention demonstrate the ability to accommodate the strain arising from the lattice mismatch between the group-III nitride-based compound semiconductors and the silicon substrate, and to form the seed crystal more effectively. In other words, because the strain-accommodating and recrystallizing effects are of crucial importance in improving the crystal quality of the group-III nitride-based compound semiconductors, and these effects serve better in the composite intermediate layers of the present invention than in the conventional AlN single buffer, the crystal quality of the group-III nitride-based compound semiconductors will be significantly improved by utilizing the composite intermediate layers. This is confirmed by the intense and narrow optical emission peak observed in the PL spectra of the GaN-based semiconductor films grown by using the composite intermediate layers of the present invention. The x-ray diffraction data provides additional evidence to this conclusion. The detailed description will be given below in Example 1.

Note that the optimal values in total layer thickness and composition for the composite intermediate layers of the present invention apparently depend on the selection of the constituent semiconductors as well as the subsequently grown group-III nitrides and related compound semiconductors. At the present time since the physical origin of the composite intermediate layers is unfortunately not very clear, it is truly difficult to theoretically determine or predict the optimal layer thickness of the composite intermediate layers for a special material combination. In other words, the optimal value for a special material combination can now only be determined by experiment. However, the existence of the optimal layer thickness for the composite intermediate layers can be interpreted qualitatively as follows. Generally a buffer layer grown at a low temperature provides seed crystals which act as nucleation sites with low orientational fluctuation to promote the lateral growth of the group-III nitrides. The composite intermediate layers of the present invention which consist of an ultra-thin amorphous silicon film and a multi-layered buffer provide more seed crystals as well as additional interfaces for the misfit dislocations to terminate than a conventional single buffer layer. However, if the composite intermediate layers are too thin, they may neither effectively accommodate the elastic strain due to the large lattice mismatch between the group-III nitride crystals and the silicon substrate nor provide sufficient amount of seed crystals for the subsequent growth of the group-III nitrides. On the other hand, if the composite intermediate layers are too thick, they tend to bring about excessive amount of the seed crystals with high orientational fluctuation. Therefore, there should be an optimal layer thickness for the composite intermediate layers.

It is also to be emphasized that the composite intermediate layers of the present invention, which consist of an ultra-thin amorphous film or any stress-relief film or a combination of them and at least one multi-layered buffer can be formed not only on a silicon substrate but also on any substrate which are presently used or may be developed in the future, such as SiC, GaP, InP, and GaAs substrates if the constituent semiconductors for the composite intermediate layers are selected correspondingly. The composite intermediate layers can even be formed on the surface of the epitaxial layers of group-III nitrides and related compound semiconductors. This characteristic implies that the composite intermediate layers of the present invention can be applied to the regrowth of group-III nitride-based compound semiconductors on the as-grown nitrides.

Examples of the present invention are described below with reference to the accompanying drawings. First, the method for growing an undoped GaN crystal over composite intermediate layers consisting of an ultra-thin (less than 500 nm) amorphous silicon film and a three period GaN/Al$_x$Ga$_{1-x}$N (x=0.2) multi-layered buffer on a silicon (001) substrate (Example 1) is described in detail. The optical properties of the GaN film grown over the composite intermediate layers of the present invention are compared with those of samples grown over conventional intermediate layers based on the characterization results obtained by PL spectroscopy and x-ray diffraction profile. Subsequently, the layer structure and the growth method for a specific GaN-based light emitting diode grown over the composite intermediate layers consisting of an ultra-thin (less than 500 nm) amorphous silicon film and a six period GaN/Al$_x$Ga$_{1-x}$N (x=0.2) multi-layered buffer on n-type silicon (001) substrate coated with a 150 nm-thick amorphous silicon film, is described Example 2). These examples, however, merely exemplify the method of practicing the technical concepts of the present invention. Therefore, the method of the present invention is not particularly limited to the following examples in terms of, for example, the growth conditions and the combination of the materials used. Various modifications can be made for the growth method of the present invention in accordance with the scope of claims.

Example 1

Figure 3:
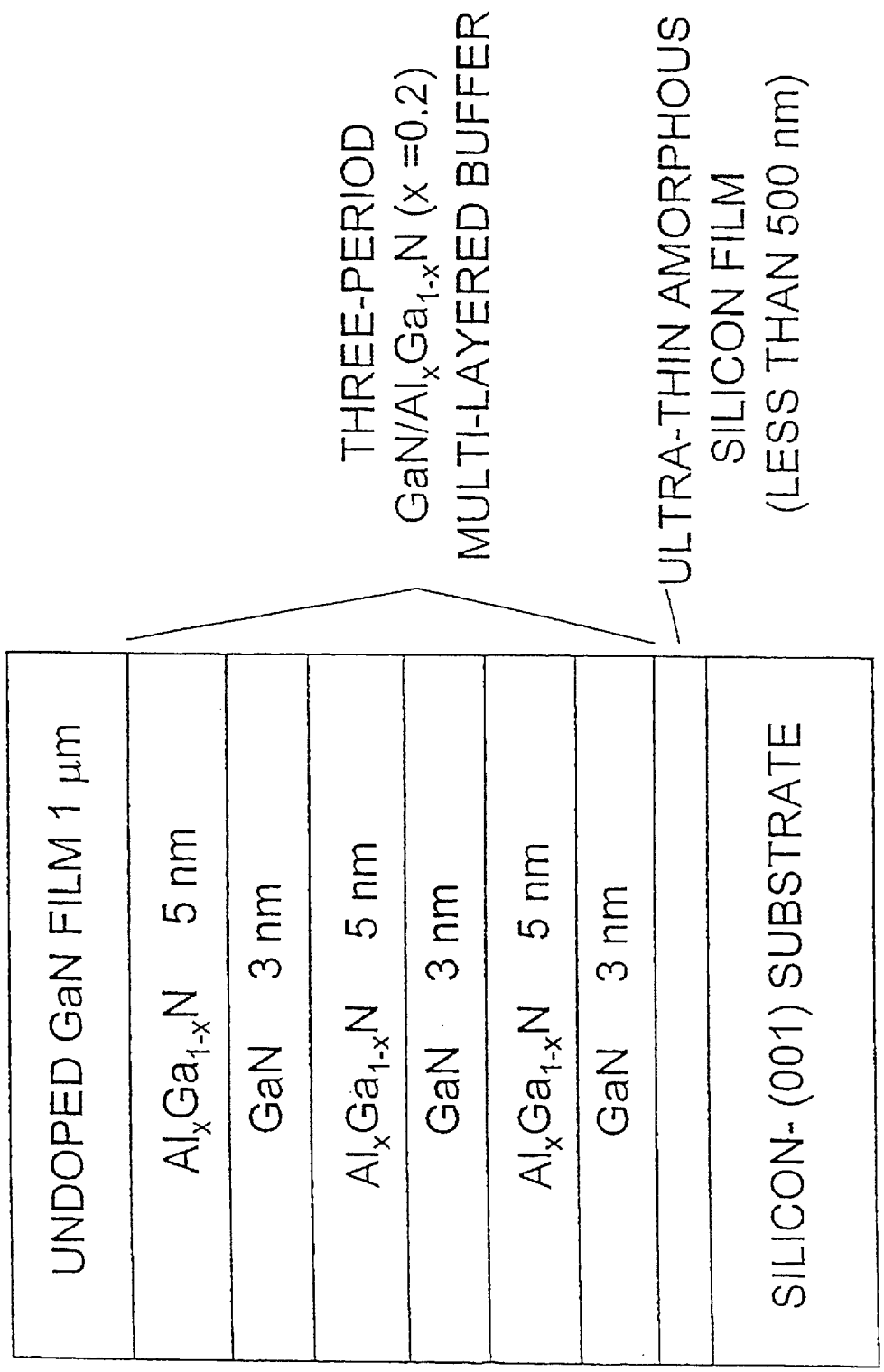
FIG. 3 is a schematic sectional view showing an undoped GaN crystal grown over composite intermediate layers consisting of an ultra-thin (less than 500 nm) amorphous silicon film and a three period $GaN/Al_xGa_{1-x}N$ (x=0.2) multi-layered buffer on a silicon (001) substrate according to Example 1 of the present invention.

FIG. 3 shows a undoped GAN crystal grown over composite intermediate layers consisting of an ultra-thin (less than 500 nm) amorphous silicon film and a three period GaN/Al$_x$Ga$_{1-x}$N (x=0.2) multi-layered buffer on a silicon (001) substrate. Referring to FIG. 3 after a chemical cleaning process, the silicon (001) substrate is thermal-treated in a MOCVD reactor chamber under hydrogen ambient at a high temperature (preferably over 900° C.) for at least 5 minutes in order to produce a clean, oxide-free surface. The temperature is then reduced to a low temperature (preferably between 400–750° C.), and an ultra-thin (preferably less than 500 nm) amorphous silicon film is deposited on the surface of the above mentioned silicon (001) substrate using hydrogen-diluted silane as a precursor in order to form a "soft" buffer on the silicon substrate. A three period GaN/Al$_x$Ga$_{1-x}$N (x=0.2) multi-layered buffer is then MOCVD-grown on the top of the formed ultra-thin amorphous silicon film at a low temperature (preferably between 400–750° C.). The film thickness of GaN and Al$_x$Ga$_{1-x}$N are set to 3 nm and 5 nm, respectively, corresponding to a total layer thickness of 24 nm for the multi-layered buffer. Subsequently, a 1 µm-thick undoped GaN epitaxial layer is grown on the surface of the composite intermediate layers consisting of an ultra-thin amorphous silicon film and a multi-layered buffer at a high temperature (preferably higher than 900° C.).

After the growth, room-temperature photoluninescence (PL) and x-ray diffraction (XRD) measurements were carried out in order to characterize the crystalline quality of the grown undoped GaN epitaxial layer and to compare the optical properties, more specifically, the intensity and linewidth of the PL emission and XRD peaks of the undoped GaN sample grown by using the composite intermediate layers of the present invention with those samples grown using the conventional methods.

Figure 4:
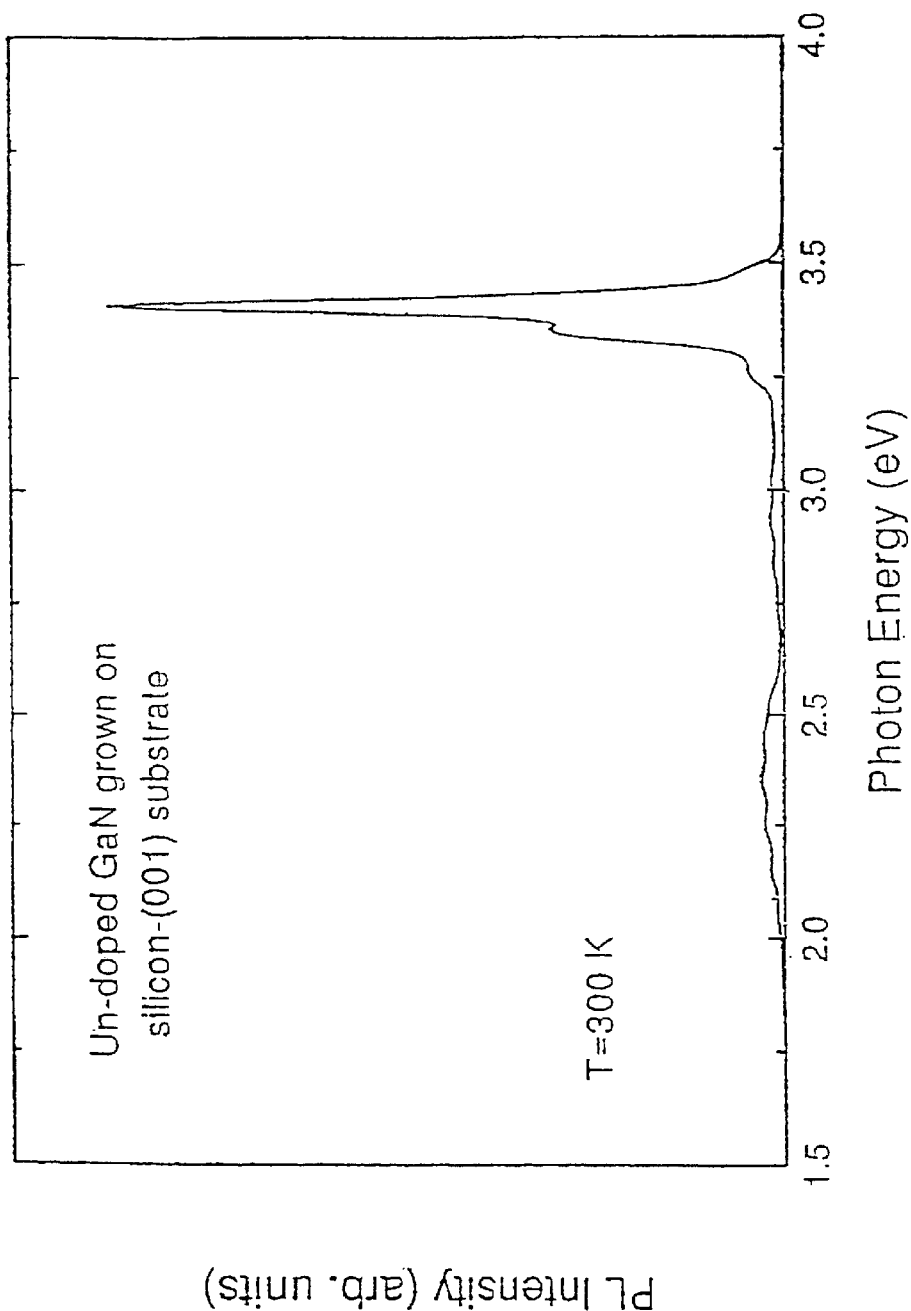
FIG. 4 is a graph showing the room temperature photoluninescence (PL) spectra of an undoped GaN film grown over composite intermediate layers consisting of an ultra-thin amorphous silicon film and a three period $GaN/Al_xGa_{1-x}N$ (x=0.2) multi-layered buffer according to Example 1 of the present invention. The fill width at half maximum of the band-edge emission peak around 3.4 eV is 40 meV which is nearly 38% narrower than the narrowest value reported so far 65 meV, indicating that the crystal quality of GaN-based semiconductor grown on a silicon substrate can be significantly improved by using the composite intermediate layers.

According to the room-temperature PL spectrum shown in FIG. 4, the PL emission of the undoped GaN epitaxial layer grown over the composite intermediate layers of the present invention is much more intense than the defects-related yellow-band emissions centered around 2.26 eV. Although it is impossible for us to directly compare our PL result with those reported by other research groups for the GaN films grown over a conventional intermediate layer on a silicon substrate, the PL intensity of the GaN band-edge-related emission peak around 3.4 eV as seen in FIG. 4 is found to be comparable to or even slightly stronger than the corresponding value for the GaN grown in our laboratory on a sapphire substrate using the low-temperature-grown GaN thin film as the intermediate layer. Furthermore, the full width at half maximum of the GaN band-edge-related emission peak is 40 meV which is nearly 38% narrower than the best value achieved so far, 65 meV, recently reported by Oshinsky et al. (Appl. Phys. Lett. Vol. 72, 1998, pp. 551–553). This fact indicates that the crystal quality of GaN-based semiconductor grown on a silicon substrate can be significantly improved by using the composite intermediate layers.

Figure 5:
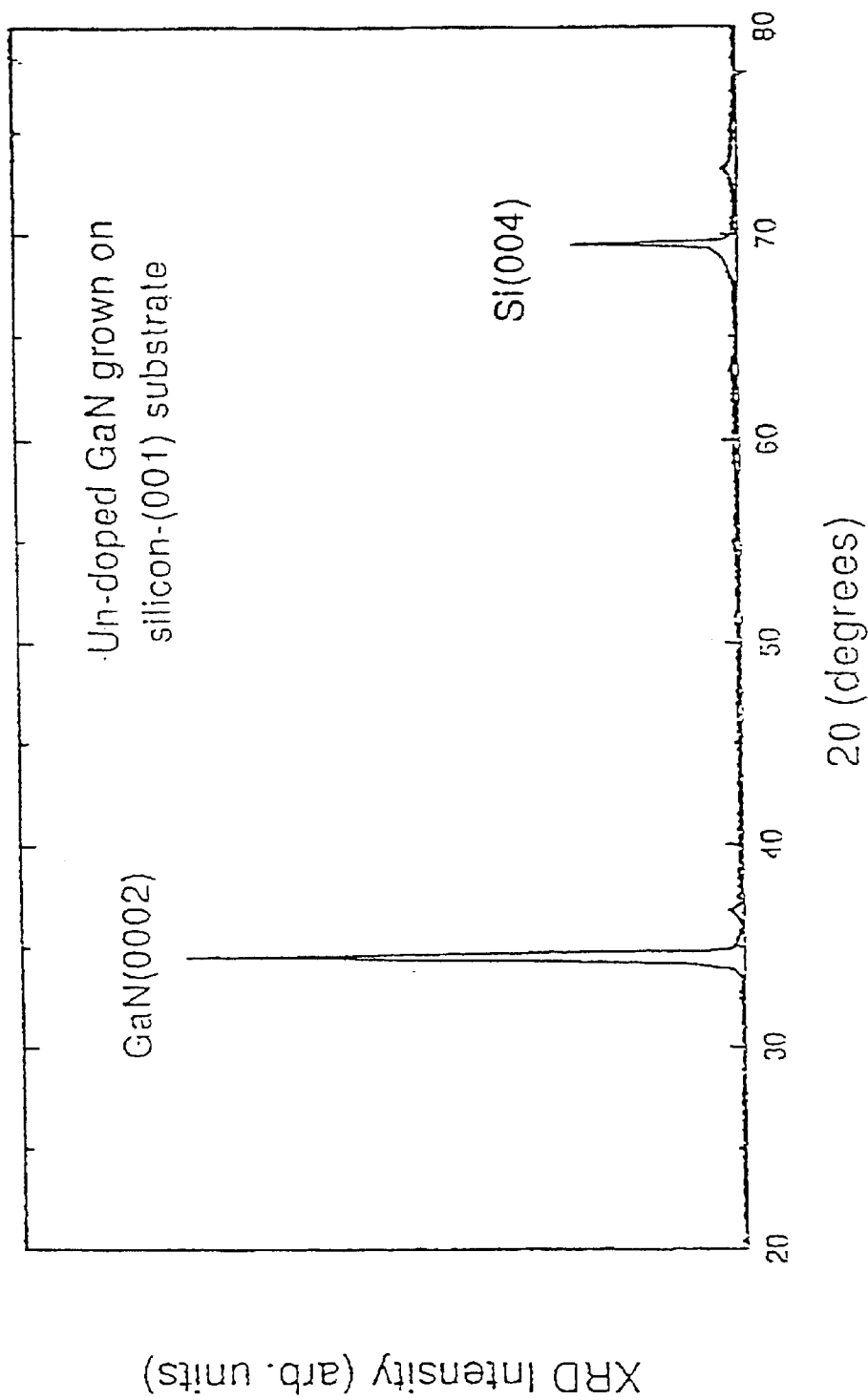
FIG. 5 is a graph showing x-ray diffraction profile and its rocking curve of the (0002) reflection for an undoped GaN film grown over composite intermediate layers consisting of an ultra-thin amorphous silicon film and a three period $GaN/Al_xGa_{1-x}N$ (x=0.2) multi-layered buffer according to Example 1 of the present invention. The full width at half maximum for the dominant (0002) diffraction peak at 34.6 arc-degrees is 40 arc-minutes.

On the other hand, the XRD measurement result illustrated in FIG. 5, shows a x-ray diffraction profile and its locking curve of the (0002) refection for an undoped GaN film grown over the composite intermediate layers consisting of an ultra-thin amorphous silicon film and a three period $GaN/Al_xGa_{1-x}N$ (x=0.2) multi-layered buffer (FIG. 3). Compared with the diffraction peak from the silicon substrate at 69.3 arc-degrees, the diffraction peak at 34.6 arc-degrees is dominant, and identified as the (0002) diffraction from the wurtzite GaN crystal. No diffraction peak from the zinc-blende (cubic) GaN is observed, and the full width at half maximum for the dominant (0002) diffraction peak is as narrow as 11 arc-minutes which is much better than the corresponding value (108 arc-minutes) reported recently by Wang et al. (Appl. Phys. Lett. Vol. 72, 1998, pp. 109–111) who used a thin $\gamma A_2O_3$ film as an intermediate layer. These facts also reveal that the crystal quality of GaN-based nitrides can be significantly improved by using the composite intermediate layers of the present invention.

Example 2

FIG. 6 shows the schematic sectional view of a GaN-based light emitting diode fabricated on a silicon substrate according to Example 2 of the present invention The detailed fabrication process is as follows.

Referring to FIG. 6, after the chemical cleaning process, the n-type silicon (001) substrate on top of which a 150 nm-thick amorphous silicon film was pre-grown by chemical vapor deposition, is heated in a MOCVD reactor chamber under hydrogen ambient at a high temperature (preferably over 900° C.) for at least 5 minutes in order to produce a clean, oxide-free surface. The temperature is then reduced to a lower temperature (preferably between 400–750° C.), and an ultra-thin (preferably less than 500 nm) amorphous silicon film is deposited on the surface of the above mentioned silicon (001) substrate using hydrogen-diluted silane as a precursor in order to form a "soft" buffer on the silicon substrate. A six period $GaN/Al_xGa_{1-x}N$ (x=0.2) multi-layered buffer is then grown by MOCVD on the top of the formed ultra-thin amorphous silicon film at a low temperature (preferably between 400–750° C.). The film thickness of GaN and $Al_xGa_{1-x}N$ are set to 3 nm and 5 nm, respectively, corresponding to a total layer thickness of 48 nm for the multi-layered buffer. Subsequently, a 0.5~2 μm-thick Si-doped GaN epitaxial layer and a 100 nm-thick Si-doped $Al_xGa_{1-x}N$ (x=0.2) epitaxial layer are grown by MOCVD successively on the surface of the composite intermediate layers consisting of the ultra-thin amorphous silicon film and the multi-layered buffer at a high temperature (preferably higher than 900° C.). The temperature is then reduced to a lower temperature (preferably between 650–850° C.) and the carrier gas for the MOCVD growth is switched over from hydrogen to nitrogen simultaneously to grow a number of 5–15 nm-thick $In_yGa_{1-y}N$ (0<y<0.5) epitaxial layers to form the quantum well. Subsequently, the temperature is raised to a high temperature (preferably higher than 900° C.) again and a 100 nm-thick Mg-doped $Al_xGa_{1-x}N$ (x=0.1) epitaxial layer and a 0.5~1 μm-thick Mg-doped GaN epitaxial layer are MOCVD-grown successively on the surface of $In_yGa_{1-y}N$ quantum well. Finally, a Ni/Au contact is evaporated onto the Mg-doped p-GaN layer and a Ti/Au contact onto the Si-doped n-GaN layer to accomplish the fabrication of the p-n junction.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A crystal growth method for the group-III nitride-based compound semiconductors comprising:

MOCVD-growing an ultra-thin layer comprising an amorphous silicon film or any stress-relief film or a combination of an amorphous silicon film and a stress-relief film on a part of or the entirety of the surface of a silicon substrate at a first temperature using hydrogen-diluted silane as a precursor;

MOCVD-growing a composite intermediate layer comprising at least one periodic or non-periodic multi-layered buffer on the top of said ultra-thin layer at a higher temperature or at said first temperature, MOCVD-growing a single layer or multiple layers of group-III nitride-based compound semiconductors over said composite intermediate layer and said ultra-thin layer at a second temperature.

2. The crystal growth method according to claim 1, said method further comprising:

doping a n- or p-type in said-group-III nitride based compound semiconductor.

3. The crystal growth method according to claim 1, wherein said silicon substrate is made of silicon wafer having any possible orientation.

4. The crystal growth method according to claim 1, wherein said ultra-thin layer is pre-grown on said silicon substrate.

5. The crystal growth method according to claim 1, wherein said ultra-thin layer has a thickness of less than 500 nm.

6. The crystal growth method according to claim 1, further comprising growing group-III nitride-based films in between different multi-layered buffers.

7. The crystal growth method according to claim 1, wherein said first temperature is between 400 to 750° C., said higher temperature is between 750 to 900° C. and said second temperature is greater than 900° C.

8. The crystal growth method according to claim 2, wherein said ultra-thin layer is pre-grown on said silicon substrate.

9. The crystal growth method according to claim 3, wherein said ultra-thin layer is pre-grown on said silicon substrate.

* * * * *